May 12, 1964 L. FLEMING 3,133,229
ACTUATION LEVEL CONTROL CIRCUIT FOR
AN ELECTRO-RESPONSIVE DEVICE
Filed June 12, 1950
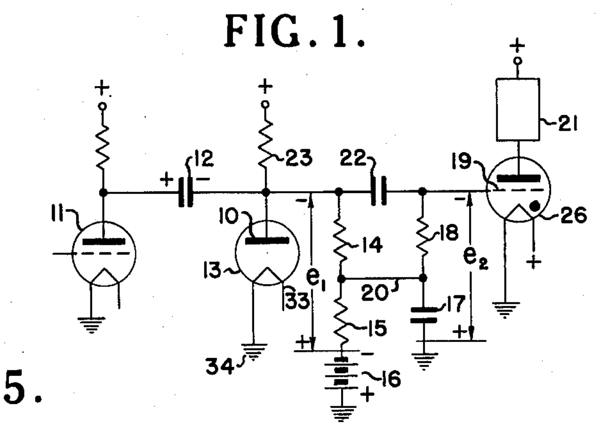
FIG. 1.
FIG. 5.
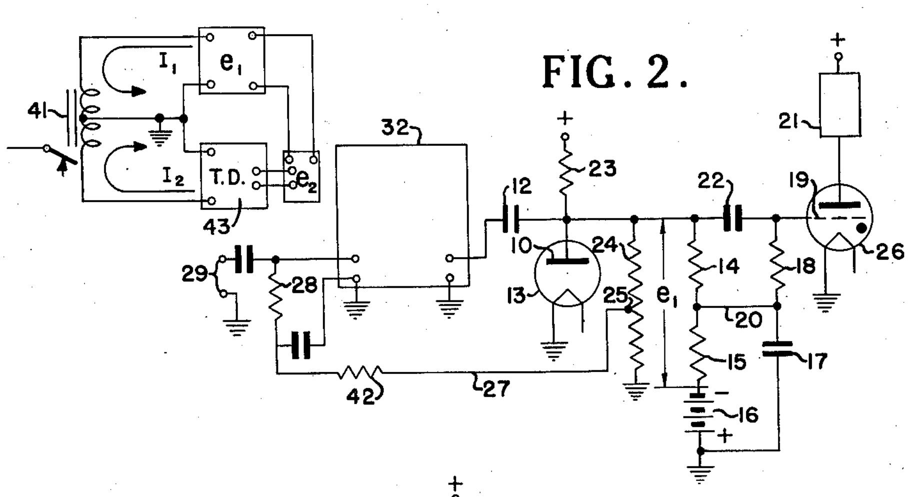
FIG. 5, FIG. 2.
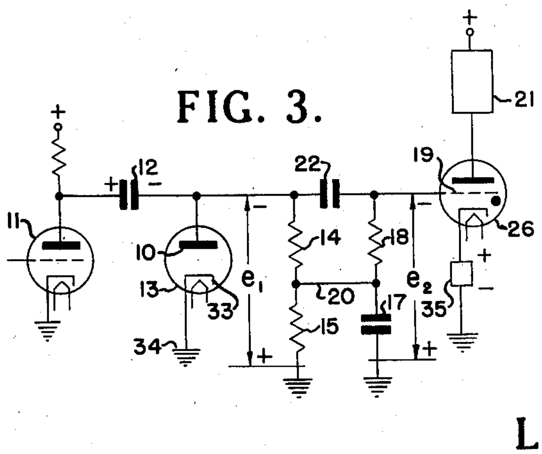
FIG. 3.
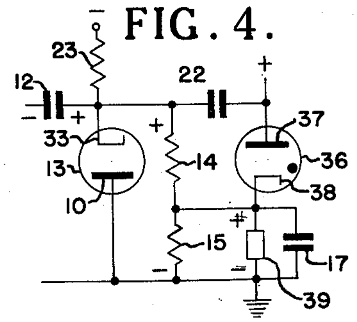
FIG. 4.
Inventor
LAWRENCE FLEMING
By [signature] [signature]
R. M. Hicks
Attorneys United States Patent Office 3,133,229

Patented May 12, 1964

3,133,229

ACTUATION LEVEL CONTROL CIRCUIT FOR AN ELECTRO-RESPONSIVE DEVICE

Lawrence Fleming, 510 N. West St., Falls Church, Va.
Filed June 12, 1950, Ser. No. 167,635
13 Claims. (Cl. 315—238)
(Granted under Title 35, U.S. Code (1952), sec. 266)

This invention relates to improvements in actuation circuits and more particularly to improvements in actuation circuits of the type used to cause actuation of an electro-responsive device in response to signals received thereby. In particular, the invention is useful in improving the operation of those actuation circuits in which actuation of a device is achieved upon the occurrence of a signal amplitude increment of predetermined magnitude selectively in accordance with the rate of increase of the signal increment and in which signal increments of lower rate of increase are ineffective to actuate the device. One example in which such an actuation circuit is required is the radio proximity fuze as used on anti-aircraft projectiles. In this case, actuation of the detonator must not occur for steady signals such as those due to reflections from the surface of the sea but actuation must occur for a rapid signal increment such as that due to the projectiles passing near a signal reflector such as an aircraft.

This invention is particularly adapted for use with circuits in which the signal applied to the actuation device is obtained from an amplifier although amplification of the signal is well known in the art to provide the proper signal amplitude for application to the actuation device. In prior art devices of this type it is well known to provide an automatic gain control (AGC) potential to decrease the gain of one or more of the amplifier stages preceding the electro-actuated device in order that the level of signal required for actuation of the utilization device is not reached due to amplification of noise inherent in the circuit or the presence of a steady background signal. While such prior art systems are generally satisfactory they possess certain disadvantages, one disadvantage being that the AGC circuit decreases the sensitivity of the amplifier to incremental signals of increasing strength for which actuation of the electroresponsive device is desired, since the gain of the amplifier of the prior art devices is reduced as to desired signals as well as to steady background levels. The input signal increment required for actuation thus would have to be larger in proportion as the gain of the amplifier is reduced due to the action of the AGC circuit aforesaid.

The present invention overcomes the difficulties of the prior art devices by applying a potential proportional to the background signal to control the actuation level of the electro-actuated device in contradistinction to controlling the gain of any amplifier which may precede the device in signal sequence. In this manner, the actuation level becomes proportionally higher in the presence of background signal or noise, and the gain of an amplifier, if employed, is not reduced so as to prevent actuation upon normal incremental signals.

The term actuation level, as used in this specification, means the magnitude of signal which must be supplied to the actuation device to cause actuation under the then existing bias conditions effective in the circuit and is to be distinguished from the operating level of the device per se which is a characteristic of the device as such irrespective of the circuit in which it may be placed. A simple example will make this clear. If the operating level of the device per se is reached upon the application of plus one volt (+1) and a bias of minus one volt (−1) is effectively applied to the device then the actuation level is plus 2 volts (+2). This concept is further brought out hereinafter in relation to the present invention by another example.

The term actuation level as employed herein is also distinguished from signal level which as employed herein refers to the magnitude of the signal without regard to the actuation level of the actuation device. The signal level varies with changes in background, spurious signals, and the signals desired to be detected.

It is well known that when a device is adapted to be actuated by a signal of predetermined level, that level may be achieved by the combination of two or more signal sources such as background, spurious signals, and the signals to be detected. In an actuation device of the thyratron type, actuation normally would mean the initiation of conduction between the plate anode and cathode which in a given case would occur, say, if the potential of the grid at any time becomes negative with respect to the cathode by less than one volt (1 volt). If a direct current bias of negative four volts (−4 volts), in this assumed example, is applied to the grid to maintain the tube normally non-conducting, the superimposed signal component which must be applied to the grid to initiate conduction would have to exceed positive three volts (+3 volts). Obviously, if a background signal produces a component in excess of +3 volts actuation will occur. To prevent this, the circuit of the present invention rectifies this background signal and applies a fractional portion, say two-thirds (⅔), of it as additional negative direct current bias to the thyratron grid making the grid to cathode potential −6 volts (i.e. $-4+⅔(-3)=-6$ in the assumed example). Since the background signal component is +3 volts an additional component in excess of +2 volts is required to make the gride to cathode potential more positive than −1 volt and cause tube conduction. Thus it should be apparent by this example that in a thyratron circuit designed to be actuated by a signal of +3 volts in the absence of background signals, the circuit of the invention increases the actuation level of the thyratron to approximately +5 volts if a background level of +3 volts exists. The additional +2 volts required for actuation in this case is of magnitude comparable to the original +3 volt design value. This desired result is accomplished by the circuit of the invention without any decrease in gain in a preceding amplifier.

In utilizing the principle of the invention as set forth in this example a time delay is introduced by means of an RC circuit in applying the aditional direct current bias to the thyratron grid. In this manner a desired result is achieved in that signals which increase at greater than a rate determined by the delay introduced are effective to cause actuation before any significant increase in actuation level can result therefrom.

It is an object of this invention to provide a new and improved circuit for an electro-actuated device.

Another object of this invention is to provide an improved circuit for an electro-actuated device in which the actuation level of the device is varied in time delayed relation in accordance with changes in the magnitude of signals received for actuation of the device.

A further object is to provide an improved control circuit for an electro-responsive device in which the actuation level of the controlled device is varied for slowly varying signal levels but is not varied appreciably during, or for some time after the occurrence of a rapid change in signal level.

A still further object is to utilize rectified currents derived from the signal to vary the effective bias of an electron discharge device selectively in accordance with changes in the signal level.

An additional object resides in the provision of circuit means for rendering the signal rectifier initially conductive notwithstanding the conditions of initial bias of the electron discharge device.

Other objects and many of the attendant advantages of this invention will be readily appreciated as the same becomes better understood by reference to the following detailed description when considered in connection with the accompanying drawings wherein:

FIG. 1 is a diagrammatic view of a circuit employing the invention to control the grid bias on a gaseous discharge device of the directly heated filament cathode type;

FIG. 2 is a diagrammatic view of a circuit similar to the circuit of FIG. 1 in which AGC has been added;

FIG. 3 is a diagrammatic view of one form of the invention using indirectly heated cathode tubes;

FIG. 4 is a diagrammatic view of an alternative circuit of the invention employed to control initiation of conduction in a two element discharge device; and FIG. 5 is a view of a relay supplied by currents in accordance with the principle of the invention.

Referring now to the drawings for a more complete understanding of the invention and in particular to FIG. 1 thereof there is shown a conventional amplifier tube 11 coupled by means of capacitor 12 to diode 13 and to the voltage divider formed by resistors 14 and 15 which is grounded from one end of resistor 15 through bias battery 16. Coupled to diode plate 10 by means of capacitor 22 is grid 19 of gaseous discharge device 26 which may be of the thyratron type. The junction of resistors 14 and 15 is also coupled to grid 19 by means of lead 20 and resistor 18. Lead 20 is connected by capacitor 17 to ground. Tube 26 as the utilization device may be used as a visual indicator or may be used as an electro-actuated switch to initiate current flow through a load device 21. Diode plate 10 is also connected through resistor 23 to a source of positive potential which may conveniently be the same source which supplies positive potential to amplifier 11 and tube 26. Such a source may have its negative terminal connected to the common ground points of the circuit such as 34.

The invention can best be described by reference to the modification thereof shown in FIG. 3 in which the aforementioned resistor 23 and battery 16, which are employed in FIG. 2, are not required due to the provision of the initial bias on the thyratron by means of voltage element 35 in the thyratron cathode lead. A signal from amplifying tube 11 is rectified by rectifier 13 resulting in a charge on capacitor 12 of polarity as indicated which will give rise to the voltage $e_1$ across the voltage divider 14—15 with a polarity as shown. This voltage biases diode 13 such that subsequent positive voltage peaks of magnitude equal to or less than $e_1$ are not rectified but are transmitted to grid 19 by capacitor 22 and are effective to initiate conduction in tube 26 if of sufficient magnitude to overcome the existing bias effective on tube 26. In the absence of capacitor 17, the voltage $e_1$ would divide across resistors 14 and 15 and the voltage $e_2$ would be equal to $$\frac{R_{15}e_1}{R_{14}+R_{15}}$$

This voltage $e_2$, appearing on grid 19 and of proper polarity to aid the initial bias from element 35 would act to increase the actuation level of tube 26. However, as is well known in the art, the voltage across capacitor 17 cannot change instantaneously, hence when $e_1$ appears, the voltage $e_2$ gradually begins to increase in magnitude and approaches the value $$\frac{R_{15}e_1}{R_{14}+R_{15}}$$

as a maximum. The same action occurs for any rapid change in the magnitude of $e_1$; the corresponding change in $e_2$ does not follow immediately but reaches equilibrium only after a definite time which is determined principally by the RC product of the values of resistors 14 and 15 and capacitor 17. Thus the voltage $e_2$ as derived in the manner above set forth is available for control purposes is proportioned to the signal, $e_1$, supplied by amplifier 11 and does not immediately respond to rapid changes in the signal magnitude.

Such an arrangement is well adapted to control the actuation level of tube 26 since for gradual increases in signal from amplifier 11 the voltage $e_2$ increases and is of such polarity that grid 19 is biased more negatively with the result that the A.C. peaks transmitted to grid 19 by capacitor 22 must be of sufficient amplitude to overcome this bias if tube 26 is to conduct. For a rapid increase in signal the bias $e_2$ does not change rapidly enough to prevent the A.C. peaks transmitted by capacitor 22 from actuating tube 26 if of sufficient magnitude to overcome the bias existing just prior to the signal increase. Thus the circuit of the invention acts to prevent actuation on background signals but retains full gain to amplify rapid increments which can be effective to actuate tube 26 before a change in the actuation level thereof can result from such incremental signal.

Referring now to FIG. 1, the application of the invention to control the actuation level of a negative-grid filament type thyratron will now be described. The operation of the circuit of FIG. 1 is similar to the circuit of FIG. 3 except that the initial bias of tube 26 is provided on grid 19 thereof by battery 16, and plate 10 of the tube 13 is connected through resistor 23 to a source of positive potential. This arrangement is particularly well suited for use where filamentary type tubes are employed and one side of the heater is required to be grounded. Under such conditions a voltage element such as 35 in FIG. 3 cannot be employed in the cathode circuit and the initial bias must be applied to the grid 19 from a suitable source such as battery 16 through resistor 15, lead 20 and resistor 18. The negative voltage from battery 16 reaches plate 10 of diode 13 through resistors 14 and 15 and would bias diode 13 such that rectification would not occur for small signals if it were not for the connection of diode plate 10 to a source of positive potential through resistor 23. The action of resistor 23 is such as to permit a small current to flow through diode 13 even in the presence of the negative voltage from battery 16 and hence maintain the diode operating point near the discontinuity, in its voltage-current characteristic, thereby obtaining rectification of signals from amplifier 11 in the conventional manner.

This desirable result is achieved when resistor 23 is of very large value, say approximately ten times the order of magnitude of the other impedance levels of the circuit, for example, approximately ten times the resistance of resistors 14 and 15. With resistor 23 permitting diode 13 to rectify in the manner described in connection with FIG. 3, the description as to voltages $e_1$ and $e_2$ is the same as for FIG. 3 except that $e_2$ in FIG. 1 will be with respect to a constant reference voltage as determined by the battery 16 and the voltage divider formed by resistors 14 and 15.

In FIG. 2, a modification of the circuit of FIG. 1 is shown in which AGC has been added. The operation of this circuit is the same as hereinbefore set forth in regard to the circuit of FIG. 1 except that for any given background signal which may be applied to input terminals 29 the resulting voltage $e_1$ across resistors 14 and 15 which acts to change the bias on grid 19 will be smaller due to the AGC action. Thus, part of the direct current voltage developed across resistor 24 appears at tap 25 therein and is conducted via lead 27 and resistors 42 and 28 to control the gain of one or more preceding stages in the conventional manner. By combining conventional AGC and the circuit of this invention, as shown in FIG. 2, the advantages of this invention may be retained and the additional advantages of AGC can be realized, such as, for example, sufficient reduction in gain to prevent saturation of the final amplifier stage.

In FIG. 4, the circuit of the invention is applied to control initiation of conduction in a two element gaseous discharge device. Conduction is initiated in such a device when the anode 37 is positive with respect to the cathode 38 by a predetermined potential. Operation of this circuit is similar to that described for the circuits of FIGS. 1 and 3 and can be described as follows. Incoming signals with respect to ground are coupled to cathode 33 of diode 13 by capacitor 12 and are rectified to produce a voltage on capacitor 12 of polarity as shown. This voltage appears across resistors 14 and 15 of the polarity shown and a portion of it is supplied to make the cathode 38 of tube 36 more positive by developing a potential across resistance element 39 and capacitor 17. A time delay will occur in developing this voltage due to capacitor 17 so an increase in actuation level will not be effective for rapidly increasing signals coupled to plate 37 by capacitor 22. For the foregoing purpose, element 39 may be a resistor of suitable value. When element 39 is a bias voltage source, it supplies an initial bias of polarity as shown and provision must be made to maintain diode 13 initially conductive. This is accomplished in a manner similar to that described for FIG. 1 by connecting cathode 33 through a high value resistance 23 to a source of negative potential. The negative potential would be required in this case because of the reversed polarity of the rectifier.

FIG. 5 is a diagrammatic view of a relay 41 which is supplied with two opposing currents $I_1$ and $I_2$ which can be controlled in any suitable manner according to the principle of the present invention to constitute another embodiment thereof. $I_1$ is the signal current supplied to actuate the relay 41. $I_2$ is proportioned to $I_1$ and is supplied in the desired time delayed relation to $I_1$ by any suitable time delay means 43. The current effective to operate the relay 41 is the difference in these currents, $I_1-I_2$, which must exceed the operating level of the relay. As $I_1$ increases slowly, the actuation level will increase due to the increase in magnitude of $I_2$. If $I_1$ increases rapidly enough, $I_2$ will not increase soon enough to change the actuation level in response to the increase in $I_1$. Under these conditions, the increase in $I_1$ operates the relay if the difference between the increased signal current, i.e., $I_1+\Delta I_1$ and the existing $I_2$ exceeds the operating level of the relay.

Obviously many modifications and variations of the present invention are possible in the light of the above teachings. It is therefore to be understood that within the scope of the appended claims the invention may be practiced otherwise than as specifically described.

The invention described herein may be manufactured and used by or for the Government of the United States of America for governmental purposes without the payment of any royalties thereon or therefor.

What is claimed as new and desired to be secured by Letters Patent of the United States is:

1. In a control circuit of the character disclosed, a grid controlled discharge device, a source of control potential adapted to maintain said device in a normally non-conductive condition, a rectifier, means for supplying a signal to the grid of said device, means for increasing the non-conducting condition level with respect to said signal including a voltage divider connected in shunt with said rectifier for obtaining a direct current potential proportional to said signal, and means for applying said direct current potential in aiding relation to said control potential.

2. A device according to claim 1 in which the means for applying the direct current potential includes a capacitor for effecting a time delay in the application of control by the direct current potential.

3. A device according to claim 1 in which the grid controlled discharge device is a grid controlled gaseous discharge device.

4. In a control circuit of the character disclosed, an actuation device comprising a gaseous discharge tube having at least an anode and a cathode, voltage means for supplying a positive potential to said cathode sufficient to maintain said discharge tube normally non-conductive, means for supplying actuation signals to said discharge tube, a rectifier, means for increasing the non-conducting condition level with respect to said signal including a voltage divider connected in shunt with said rectifier for obtaining a direct current potential proportional to said signals, and means for applying said direct current potential to said cathode to aid in maintaining said discharge tube non-conductive.

5. A device according to claim 4 in which the means for applying said direct current potential includes a capacitor for effecting a time delay in the application of the direct current potential.

6. In a signal control circuit of the character disclosed, an actuation device comprising a grid controlled gaseous discharge tube having a cathode, means for supplying a potential to said cathode to maintain said discharge tube normally non-conductive, means for supplying actuation signals to the grid of the tube, a rectifier, means for altering the non-conduction level of said grid control with respect to said signal including a voltage divider connected in shunt with said rectifier for obtaining a direct current potential proportional to said signals, and means for applying said direct current potential to said grid to aid in maintaining said discharge tube non-conductive.

7. A device according to claim 6 in which the means for applying said direct current potential to said grid includes a capacitor for effecting a time delay in the application of control by the direct current potential.

8. In a signal control circuit of the character disclosed, an actuation device comprising a grid controlled gaseous discharge tube, means for supplying actuation signals to the grid of said discharge tube, a source of bias potential, means for applying said bias potential to said grid to maintain said discharge tube normally non-conductive, a rectifier, means including a voltage divider in shunt with said rectifier for obtaining a direct current potential proportional to said signals, means for applying said direct current potential to said grid in aiding polarity with said bias potential, and means for maintaining said rectifier initially conductive while connected to said bias potential.

9. A device according to claim 8 in which the means for maintaining the rectifier initially conductive comprises a source of potential and a high resistance connection from one electrode of said rectifier to said source of potential.

10. A device according to claim 9 in which the means for supplying actuation signals comprises at least one amplifier stage the gain of which may be controlled by a gain control potential and means for supplying said gain control potential from said direct current potential.

11. A device according to claim 9 in which the means for applying the direct current potential to said grid includes a capacitor for effecting a time delay in the application of the direct current potential.

12. In a control circuit of the character disclosed, an actuation device comprising a normally non-conductive electron discharge device having at least two electrodes, means for supplying actuation signals to one of said electrodes, a rectifier, means for increasing the non-conducting condition level with respect to said signal including a voltage divider connected in shunt with said rectifier for obtaining a direct current potential proportional to said signals, and means for applying said direct current potential to said other electrode to aid in maintaining said discharge device non-conductive.

13. A device according to claim 12 in which the means for applying said direct current potential includes a capacitor for effecting a time delay in the application of said direct current potential.

References Cited in the file of this patent

UNITED STATES PATENTS

| | | |
|---|---|---|
| 1,955,874 | Demarest | Apr. 24, 1935 |
| 2,217,401 | Gieger | Oct. 8, 1940 |
| 2,509,005 | Lord | May 23, 1950 |